(12) United States Patent
Tsunoda et al.

(10) Patent No.: US 9,894,748 B2
(45) Date of Patent: Feb. 13, 2018

(54) ELECTRONIC DEVICE

(71) Applicant: FUJITSU LIMITED, Kawasaki-shi, Kanagawa (JP)

(72) Inventors: Yosuke Tsunoda, Tachikawa (JP); Akihiko Fujisaki, Kawasaki (JP); Jie Wei, Hachioji (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/461,541

(22) Filed: Mar. 17, 2017

(65) Prior Publication Data
US 2017/0295640 A1 Oct. 12, 2017

(30) Foreign Application Priority Data
Apr. 7, 2016 (JP) .................. 2016-077435

(51) Int. Cl.
H04M 1/00 (2006.01)
H05K 1/02 (2006.01)
H04M 1/02 (2006.01)
H05K 7/20 (2006.01)
H05K 9/00 (2006.01)
G06F 1/20 (2006.01)

(52) U.S. Cl.
CPC ........ *H05K 1/0203* (2013.01); *H04M 1/0202* (2013.01); *H05K 1/0212* (2013.01); *H05K 7/2039* (2013.01); *H05K 7/20336* (2013.01); *H05K 9/0024* (2013.01); *G06F 1/203* (2013.01); *H05K 2201/066* (2013.01)

(58) Field of Classification Search
CPC ............. H05K 1/0203; H05K 1/0212; H05K 7/20336; H05K 7/2039; H05K 9/0024; H04M 1/0202
USPC ...................................... 455/575.1
See application file for complete search history.

(56) References Cited

U.S. PATENT DOCUMENTS 8,159,819 B2 * 4/2012 Memon .................... G06F 1/20
165/185
2016/0282914 A1 9/2016 Saito et al.

FOREIGN PATENT DOCUMENTS

JP 2015-095629 5/2015

* cited by examiner

Primary Examiner — Sanh Phu
(74) Attorney, Agent, or Firm — Fujitsu Patent Center

(57) ABSTRACT

An electronic device includes a board having a first surface on which a heating element is mounted, a heat sink plate disposed to face the first surface of the board, and a heat pipe disposed between the board and the heat sink plate such that one end of the heat pipe is disposed at a position where the one end is in contact with the heating element, and the other end of the heat pipe is disposed to be in contact with the heat sink plate, wherein the heat sink plate has a stacking structure of a first heat sink plate of which a front surface faces the board, and a second heat sink plate disposed on a rear surface of the heat sink plate, and a through hole is formed at a position on the first heat sink plate.

9 Claims, 11 Drawing Sheets

FIG. 11

| | FIRST HEAT SINK PLATE | SECOND HEAT SINK PLATE | HEAT CONDUCTIVITY W/mk | VERTICAL ELASTICITY MODULUS kN/mm² | TENSILE STRENGTH N/mm2 | SPECIFIC GRAVITY | HEATING ELEMENT TEMPERATURE |
|---|---|---|---|---|---|---|---|
| HEAT SINK PLATE A | STAINLESS STEEL SUS304 | STAINLESS STEEL SUS304 | 16.7 | 186 | 520 | 7.9 | 83.2 |
| HEAT SINK PLATE B | COPPER C1020 | COPPER C1020 | 391 | 108 | 275 | 8.9 | 63.8 |
| HEAT SINK PLATE C | STAINLESS STEEL SUS304 | COPPER C1020 | 204 | 147 | 398 | 8.4 | 65.3 |
| HEAT SINK PLATE D | STAINLESS STEEL | ALUMINUM ALLOY | | | | | |
| HEAT SINK PLATE E | STAINLESS STEEL | MAGNESIUM ALLOY | | | | | |

ELECTRONIC DEVICE

CROSS-REFERENCE TO RELATED APPLICATION

This application is based upon and claims the benefit of priority of the prior Japanese Patent Application No. 2016-077435, filed on Apr. 7, 2016, the entire contents of which are incorporated herein by reference.

FIELD

The embodiments discussed herein are related to an electronic device.

BACKGROUND

Recently, portable electronic devices such as smart phones, tablets, and mobile PCs have been widely used. Meanwhile, the electronic devices have a tendency that the heating value generated in electronic circuits mounted inside the electronic devices increases with the implementation of the high-speed processing capability and the diversification of the processing. Since an electronic circuit, especially, an integrated circuit is a heating element that generates a large heating value, a case temperature near the heating element inside an electronic device may locally increase. Thus, there is a demand for dissipating or distributing the heat generated from the heating element to suppress the local increase of the case temperature of the electronic device.

As a method of suppressing the local increase of the case temperature, there is a method of providing a heat pipe inside the case of the electronic device to transport the heat generated in the electronic circuit to a heat sink. Here, descriptions will be made on the installation of a heat pipe 1 when the electronic device is a smart phone 10, using FIGS. 1A to 2B.

FIG. 1A is an exploded perspective view illustrating a mounting position of a heat pipe 1 in the smart phone 10 of a comparative technology. The smart phone 10 includes a heat sink plate 4, a board 5, and a battery 6 inside a case 3 provided with a touch panel 2, and a rear cover 7 for sealing the rear side of the case 3. FIG. 1A illustrates a state where a component 8A is mounted on the surface of the rear cover 7 side of the board 5, and a heating element 8 is mounted on the surface of the heat sink plate 4 side of the board 5. The component 8A is a common integrated circuit (IC) and may or may not generate heat. Descriptions of the component 8A are omitted herein.

One end of the heat pipe 1 is superimposed on the heating element present on the heat sink plate 4 side of the board 5, and the other end thereof is curved and disposed along the lateral surface of the battery 6 in order to circumvent the mounted component. FIG. 1B is a perspective view illustrating a state where the heat pipe 1, the board 5, and the battery 6 illustrated in FIG. 1A are attached to the case 3 of the smart phone 10, and represents the position of the heat pipe 1 by a dashed line.

FIG. 2A is a sectional view illustrating an installation position of the heat pipe 1 for dissipating the heat of the heating element 8 mounted on the board 5 in the comparative technology, and illustrates a partial sectional view of the smart phone 10 of FIG. 1B taken along the line X-X in FIG. 1B. However, FIG. 2A illustrates only the heating element 8 mounted on the heat sink plate 4 side of the board 5 and omits illustration of the component 8A on the rear cover 7 side of the board 5.

The heating element 8 mounted on the board 5 is generally a central processing unit (CPU). A shield frame 11 is provided around the heating element 8 in order to avoid the influence of electromagnetic waves, and the opening side of the shield frame 11 is sealed by a shield cap 12. When the heat generated from the heating element 8 is dissipated by the heat pipe 1, the heat pipe 1 is installed between the shield cap 12 and the heat sink plate 4. In this case, heat conducting sheets 13 are provided between the heating element 8 and the shield cap 12 and between the shield cap 12 and the heat pipe 1 so that the heat conduction from the heating element 8 to the heat pipe 1 is improved.

Meanwhile, since electronic devices are becoming smaller and thinner, there is a demand for reducing a distance D between the external side of the board 5 and the external side of the heat sink plate 4 when the electronic devices use the heat pipe. Accordingly, in order to reduce the space for mounting the heat pipe, a thin heat pipe 1A of which the thickness is thinned by increasing the flatness of the heat pipe 1 is used as illustrated in FIG. 2B. By using the thin heat pipe 1A, the distance (d) between the external side of the board 5 and the external side of the heat sink plate 4 may be made shorter than the distance D when the ordinary heat pipe 1 is used.

However, since the thin heat pipe 1A is formed by crushing the heat pipe 1, the heat is hardly transferred when the heat pipe 1 is excessively crushed, and thus the heat conducting effect of the heat pipe 1A is reduced. Further, since the heat pipe 1A is curved to guide the heat of the heating element to the heat sink, the length of the heat pipe from the heating element to the heat sink is long. Accordingly, heat is hardly transferred in the thin heat pipe, and thus the heat conducting effect of the heat pipe is reduced.

The following is a reference document.
[Document 1] Japanese Laid-Open Patent Publication No. 2015-95629.

SUMMARY

According to an aspect of the invention, an electronic device includes: a board having a first surface on which a heating element is mounted; a heat sink plate disposed to face the first surface of the board; and a heat pipe disposed between the board and the heat sink plate such that one end of the heat pipe is disposed at a position where the one end is in contact with the heating element, and the other end of the heat pipe is disposed to be in contact with the heat sink plate, wherein the heat sink plate has a stacking structure of a first heat sink plate of which a front surface faces the board, and a second heat sink plate disposed on a rear surface of the heat sink plate, and a through hole is formed at a position on the first heat sink plate which faces the heating element to expose the second heat sink plate.

The object and advantages of the disclosure will be realized and attained by means of the elements and combinations particularly pointed out in the claims.

It is to be understood that both the foregoing general description and the following detailed description are exemplary and explanatory and are not restrictive of the disclosure, as claimed.

BRIEF DESCRIPTION OF DRAWINGS

FIG. 11 is a view representing, in comparison, differences in heat conductivity, vertical elasticity modulus, tensile strength, specific gravity, and heating element temperature depending on the materials of first and second heat sink plates.

DESCRIPTION OF EMBODIMENTS

Figure 1A:
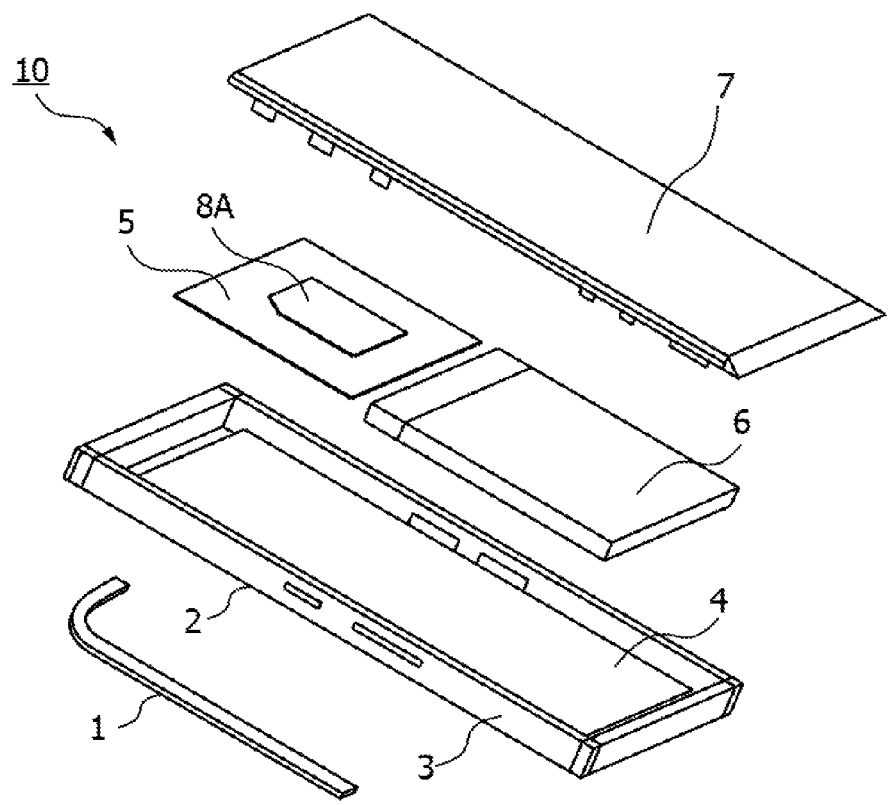
FIG. 1A is an exploded perspective view of a smart phone illustrating a mounting structure of a heat pipe in a smart phone of a comparative technology.

Hereinafter, embodiments of an electronic device according to the present disclosure will be described in detail based on specific examples using the accompanying drawings. Meanwhile, the members used in the electronic device of the present disclosure are the same as the members in the mounting structure of the heat pipe in the smart phone of the comparative technology described using FIGS. 1A to 2B, and will be denoted by the same reference numerals as used in FIGS. 1A to 2B.

Figure 1B:
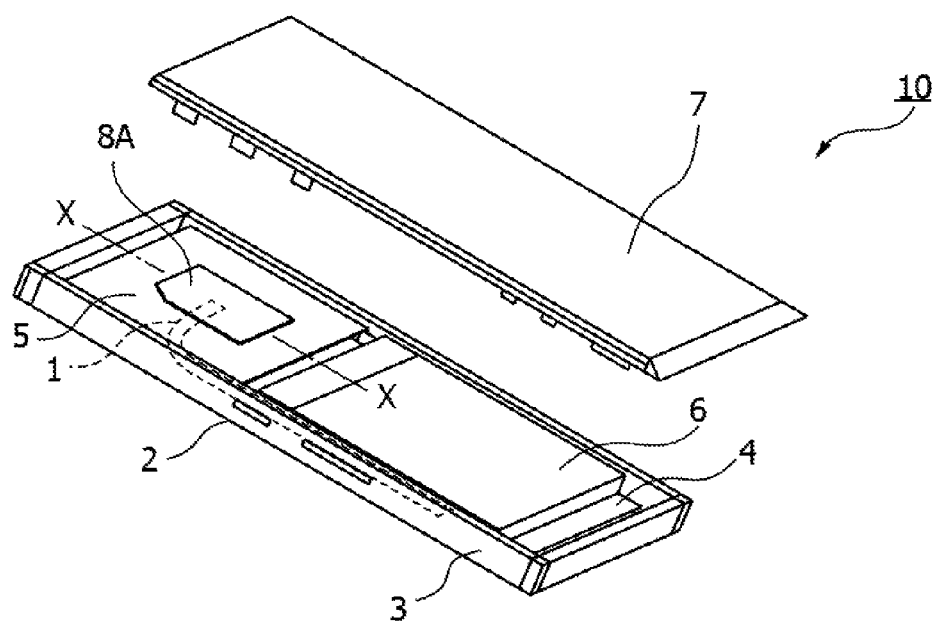
FIG. 1B is a perspective view illustrating a state where a heat pipe, a board, and a battery illustrated in FIG. 1A are attached to a case of the smart phone.
Figure 2A:
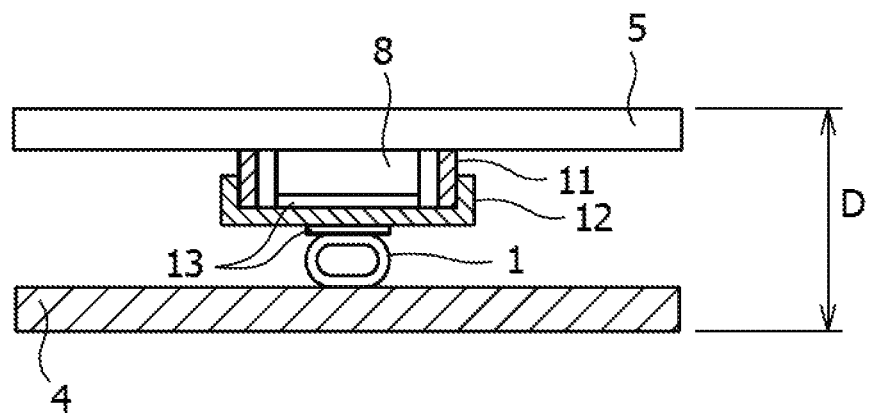
FIG. 2A is a sectional view illustrating a providing structure of the heat pipe which is taken along the line X-X of FIG. 1B.
Figure 2B:
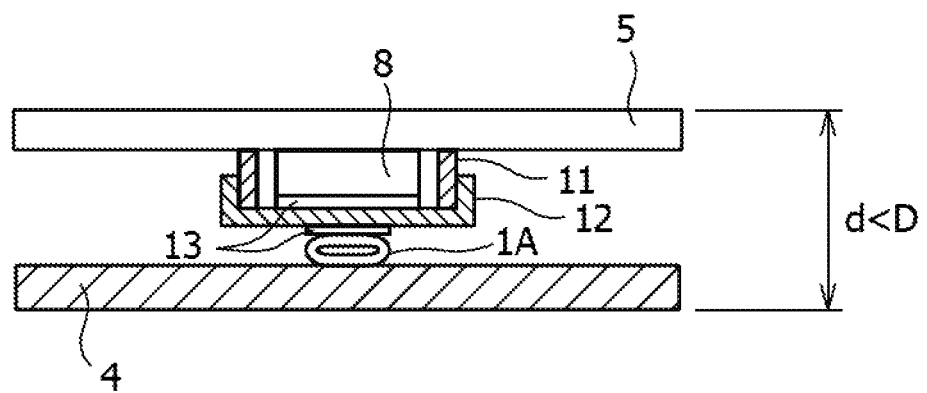
FIG. 2B is a sectional view illustrating a method of changing the thickness of the heat pipe in the providing structure of the heat pipe illustrated in FIG. 2A.
Figure 3:
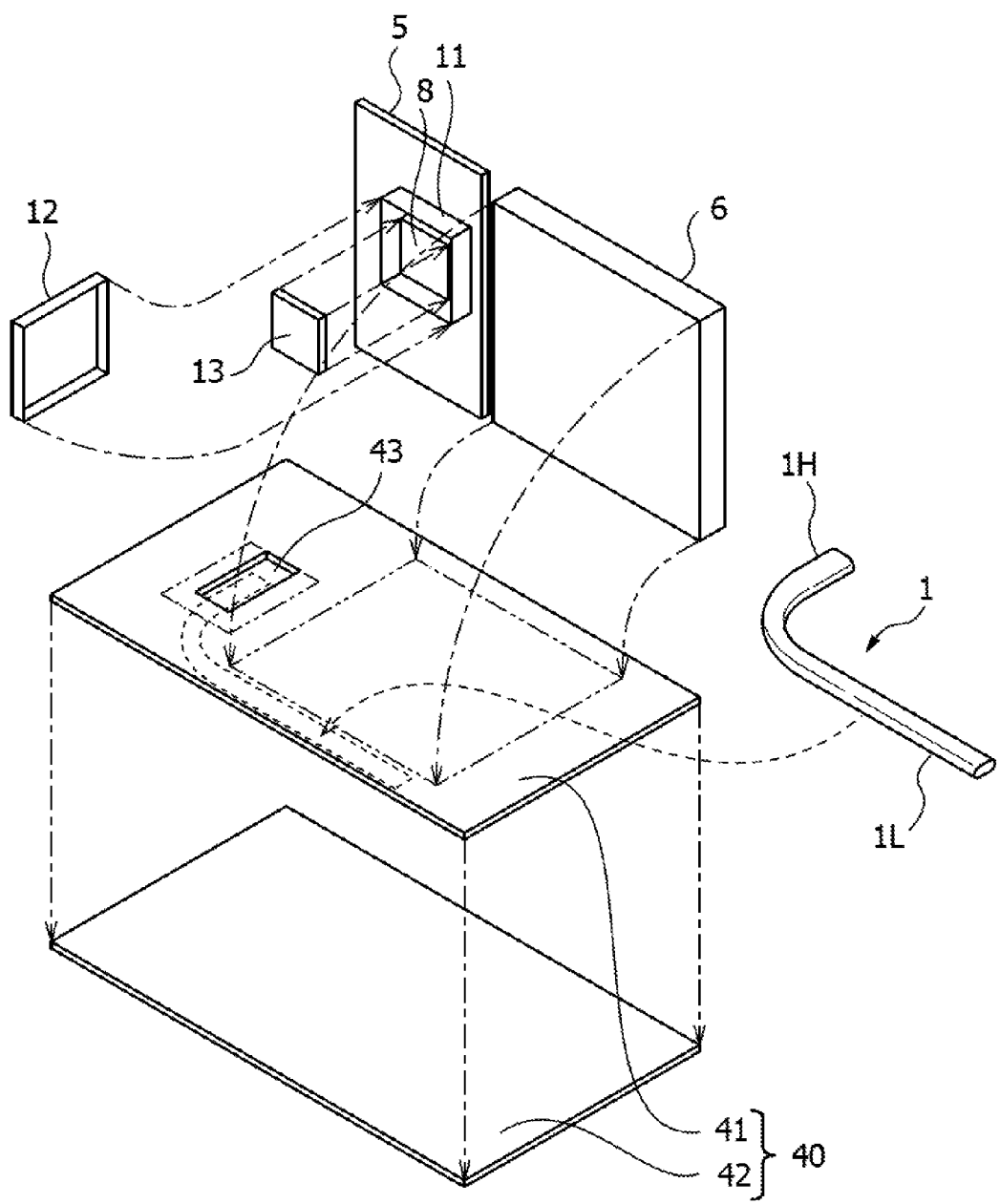
FIG. 3 is an exploded perspective view for explaining a first embodiment of a mounting structure of a heat pipe to be mounted inside an electronic device of the present disclosure.
Figure 4A:
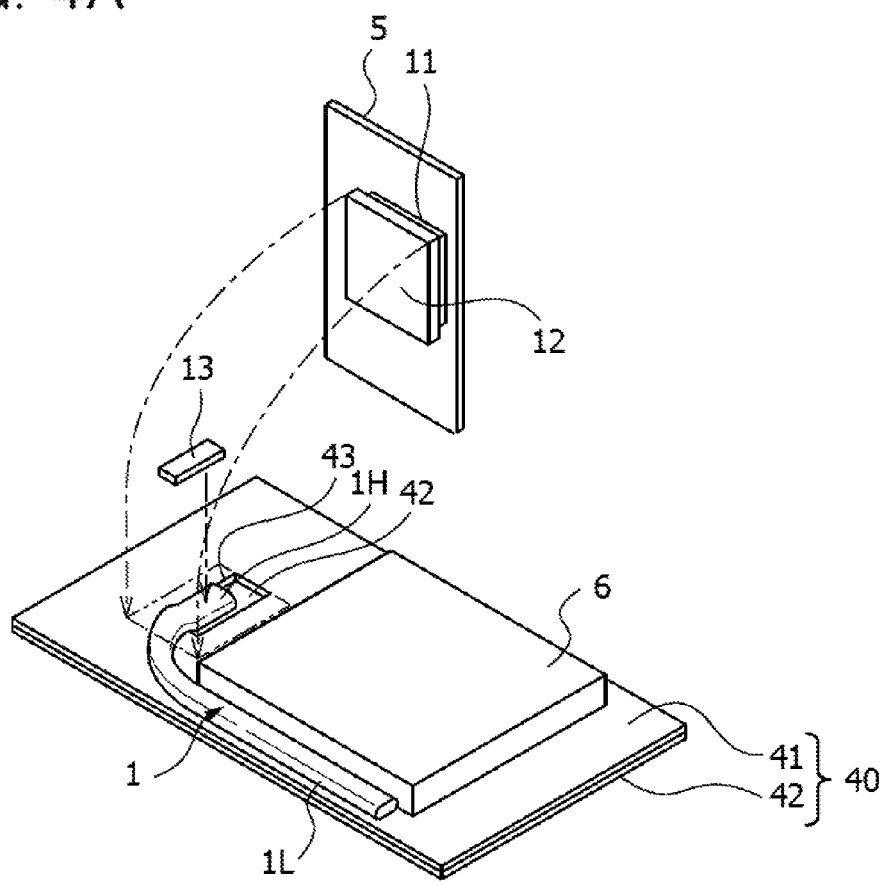
FIG. 4A is an exploded perspective view illustrating a state where the heat pipe is mounted on a heat sink plate illustrated in FIG. 3.

FIGS. 3 and 4A are exploded perspective views for explaining a first embodiment of a mounting structure of a heat pipe 1 to be mounted inside the electronic device of the present disclosure. The case of the electronic device illustrated in FIGS. 1A and 1B is omitted in FIGS. 3 and 4A. The heat sink plate 4 provided in the comparative technology described above in FIGS. 1A to 2B is a single plate. However, in the first embodiment, a heat sink plate 40 is formed by superposing a first heat sink plate 41 on a second heat sink plate 42. Hereinafter, superposing the first heat sink plate 41 on the second heat sink plate 42 may be described as stacking the first heat sink plate 41 on the second heat sink plate 42.

On the first heat sink plate 41 of the first embodiment, a portion where a high temperature portion 1H of the heat pipe 1 is to be disposed is cut out in a rectangular shape so as to form a through hole 43. In the state where the first heat sink plate 41 is stacked on the second heat sink plate 42, the second heat sink plate 42 is exposed within the through hole 43 as illustrated in FIG. 4A. The through hole 43 may have a dimension capable of accommodating the high temperature portion 1H of the heat pipe 1 with a space margin.

The first and second heat sink plates 41 and 42 may be formed of the same metal, but different metals may be stacked to form a two-tier structure. FIG. 11 represents, in comparison, heat conductivity, vertical elasticity modulus, tensile strength, specific gravity, and heating element temperature in a case where the first and second heat sink plates 41 and 42 are formed of the same metal, and heat conductivity, vertical elasticity modulus, tensile strength, specific gravity, and heating element temperature in a case where the first and second heat sink plates 41 and 42 are formed of different metals. The heating element temperature refers to a temperature of a heating element which is reduced by the heat sink plate 40 in which the first heat sink plate 41 is stacked on the second heat sink plate 42 when the heat sink plate 40 is attached to the heating element that is heated under the same condition.

Figure 10:
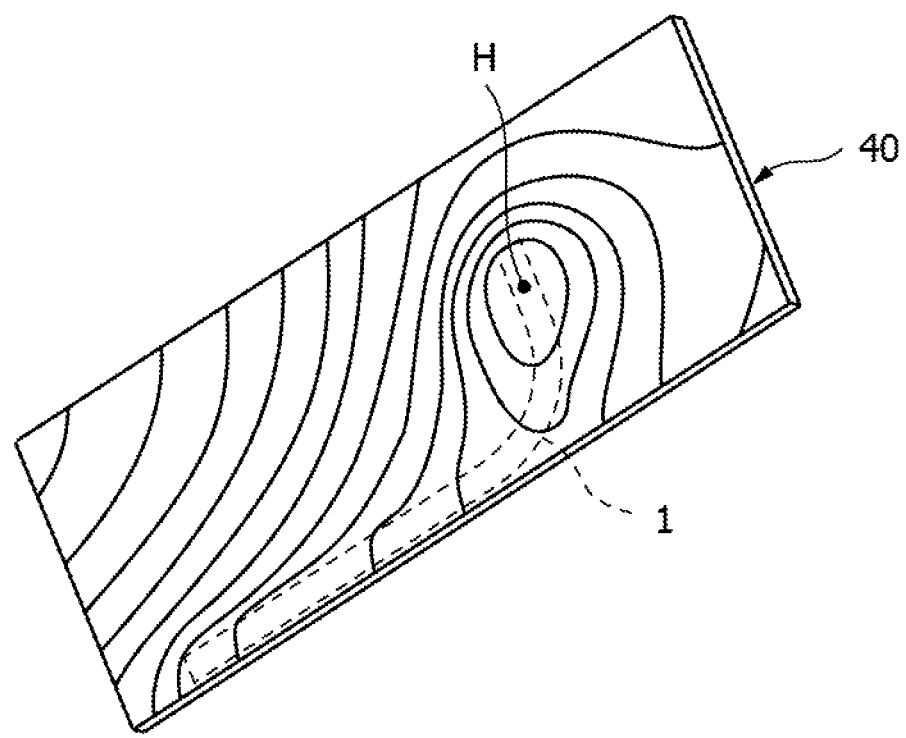
FIG. 10 is an isotherm diagram illustrating an exemplary heat distribution on the heat sink plate when a heating element is in contact with the heat sink plate.

FIG. 10 illustrates an exemplary temperature distribution of the heat sink plate 40 when a heating element of 2 W is in contact with a point H of the heat sink plate 40, and the heat pipe 1 is disposed at the position of the dashed line. While the temperature of the heat sink plate 40 decreases as the distance from the point H increases, the temperature along the longitudinal side of the heat sink plate 40 where the heat pipe 1 is disposed becomes higher than the temperature along the longitudinal side of the heat sink plate 40 where the heat pipe 1 is not disposed.

In FIG. 11, both the first and second heat sink plates 41 and 42 of a heat sink plate A are formed of a stainless steel. Both the first and second heat sink plates 41 and 42 of a heat sink plate B are formed of a copper. The first heat sink plates 41 and 42 of a heat sink plate C are formed of a stainless steel and a copper, respectively. Like the heat sink plate C, each of the heat sink plates D and E is formed by stacking two different types of metals on each other. The first heat sink plate 41 of each of the heat sink plates D and E is formed of a stainless steel. The second heat sink plate 42 of the heat sink plate D is formed of an aluminum alloy, and the second heat sink plate 42 of the heat sink plate E is formed of a magnesium alloy. The plate thickness of each of the first and second heat sink plates 41 and 42 is set to 0.1 mm.

As can be seen from FIG. 11, since both the first and second heat sink plates 41 and 42 of the heat sink plate A are formed of the stainless steel having the low heat conductivity but the large vertical elasticity modulus and tensile strength, the heat sink plate A exhibits the high strength but the low cooling capability. In addition, when both the first and second heat sink plates 41 and 42 of the heat sink plate B are formed of the copper having the higher heat conductivity but the lower vertical elasticity modulus and tensile strength than those of the stainless steel, the heat sink plate B exhibits the weak strength but the high cooling capability.

Meanwhile, in the heat sink plate C, the first heat sink plate 41 is formed of the stainless steel having the low heat conductivity but the high vertical elasticity modulus and tensile strength, and the second heat sink plate 42 is formed of the copper having the higher heat conductivity but the lower vertical elasticity modulus and tensile strength than those of the stainless steel. The heat sink plate C formed of the different types of metals in the above-described combination exhibits the high cooling capability to the same extent as that of the copper and the strength to the extent stronger than that of the copper and slightly weaker than that of the stainless steel. Meanwhile, a physical property value of the heat sink plate C is obtained by summing physical property values of the stainless steel SUS304 and the copper C1020 and dividing the sum by 2. Although data for the heat sink plates D and E are not described, the heat sink plates D and E exhibit the high cooling capability and the high strength, like the heat sink plate C.

As described above, when the first heat sink plate 41 is formed of the metal having the low heat conductivity but the high vertical elasticity modulus and tensile strength, and the second heat sink plate 42 is formed of the metal having the high heat conductivity but the low vertical elasticity modulus and tensile strength, a heat sink plate having the high cooling capability and the high strength may be obtained. Accordingly, as the heat sink plate used in the electronic device of the present disclosure, a combination of the different types of metals such as those of the heat sink plate C may be used for the first and second heat sink plates 41 and 42.

That is, when the first heat sink plate 41 is formed of a stainless steel alloy, and the second heat sink plate 42 is formed of a copper, the heat conductivity is improved over that of a heat sink plate formed of only the stainless steel alloy having the same thickness. In this case, since the copper-made heat pipe is soldered on the copper-made second heat sink plate 42, the warpage occurring due to a difference of a thermal expansion coefficient when the heat pipe is soldered on the second heat sink plate 42 may be reduced.

Meanwhile, a structure may also be adopted in which a metal having the high heat conductivity but the low vertical elasticity modulus and tensile strength is used for the first heat sink plate 41, and a metal having the low heat conductivity but the high vertical elasticity modulus and tensile strength is used for the second heat sink plate 42. In the case of the heat sink plate having the above-described structure, since a diffusion force in a surface direction is reduced, the temperature of the heating element increases. However, when the heat sink plate having the above-described structure is adopted, the heat is hardly transferred to the touch panel surface so that the temperature of the touch panel may decrease.

Referring back to FIG. 3, the battery 6 is mounted on the side far from the through hole 43 on the heat sink plate 40 in which the first and second heat sink plates 41 and 42 are stacked on each other (on the rear side of the electronic device). FIG. 4A illustrates the state where the battery 6 is mounted on the heat sink plate 40. As in the comparative technology, the heating element 8 is mounted on the board 5, and the shield frame 11 is provided around the heating element 8 in order to avoid the influence of electromagnetic waves. The opening side of the shield frame 11 is sealed by the shield cap 12 with one of the heat conducting sheets 13 interposed between the opening side and the shield cap 12.

FIG. 4A illustrates this state. Accordingly, when the board 5 is attached to the heat sink plate 40, the shield cap 12 covering the heating element 8 mounted on the board 5 is disposed at the position indicated by the alternate one long and two short dashed line around the through hole 43.

In the first embodiment, the high temperature portion 1H of the heat pipe 1 is disposed within the through hole 43 as illustrated in FIG. 4A and soldered and fixed to the second heat sink plate 42 exposed within the through hole 43. When the second heat sink plate 42 is formed of the copper, plating for the soldering of the heat pipe 1 is not required so that costs are reduced. In addition, since the heat pipe 1 is soldered on the second heat sink plate 42 within the through hole 43, the protrusion of the solder may be suppressed. In the heat pipe 1, a low temperature portion 1L is curved in the direction perpendicular to the high temperature portion 1H and disposed on the lateral surface of the battery 6 mounted on the first heat sink plate 41. The portion of the heat pipe 1 which is mounted on the first heat sink plate 41 is soldered and fixed to the first heat sink plate 41. The mounting position of the battery 6 on the heat sink plate 40 is indicated by the alternate one long and two short dashed line BT in FIG. 5A.

Figure 4B:
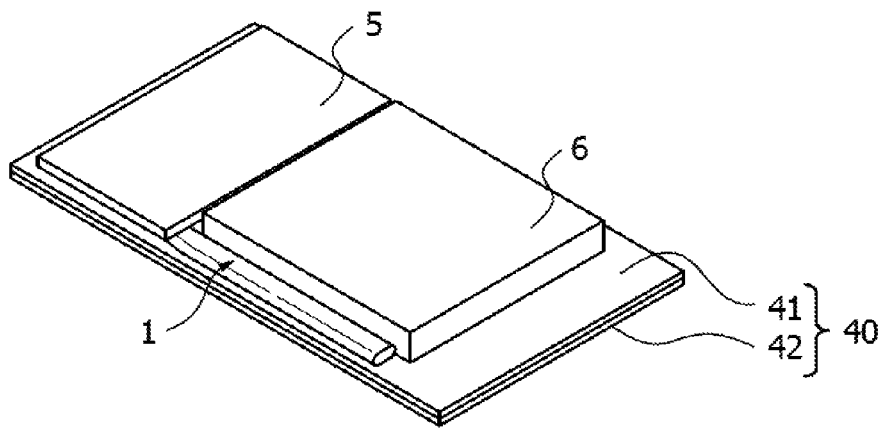
FIG. 4B is a perspective view illustrating a state where a board, the heat pipe, and a battery are mounted in the heat sink plate illustrated in FIG. 4A.
Figure 5A:
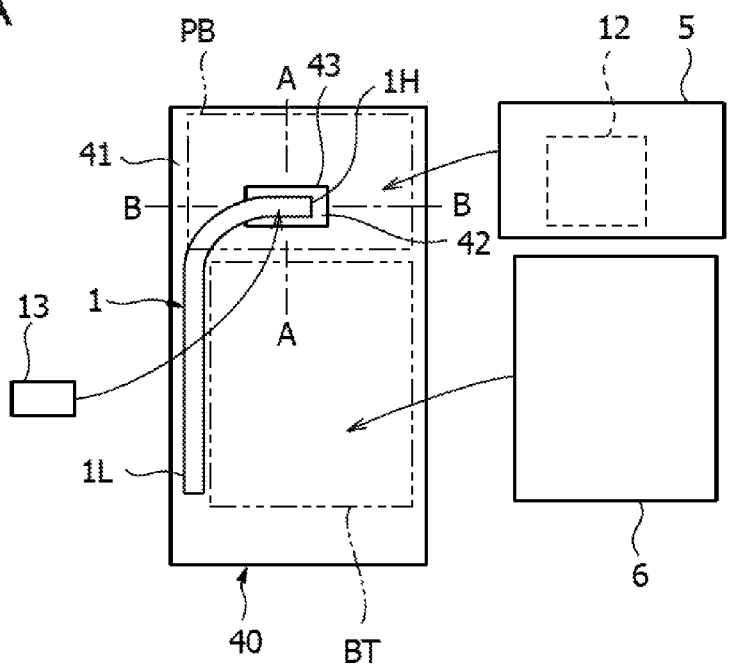
FIG. 5A is an exploded back view illustrating an order of mounting the heat pipe, the board, and the battery on the heat sink plate illustrated in FIG. 3.

In addition, as illustrated in FIGS. 4A and 5A, the board 5 is mounted on the heat sink plate 40 such that the other of the heat conducting sheets 13 is attached to the high temperature portion 1H of the heat pipe 1, and the shield cap 12 is in contact with the heat conducting sheet 13. FIG. 4B illustrates the state where the heat pipe 1, the board 5, and the battery 6 are mounted on the heat sink plate 40.

Figure 5B:
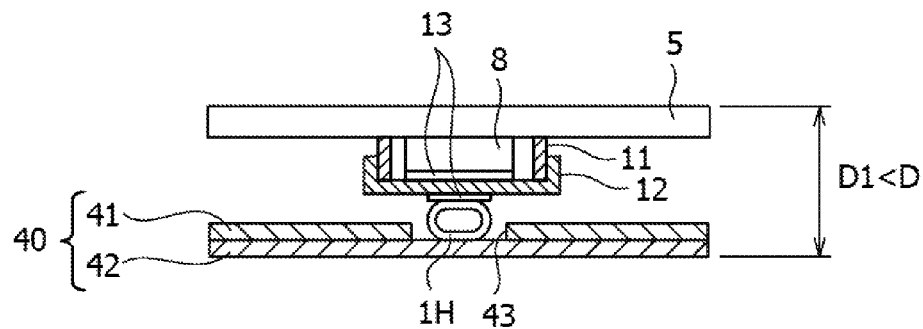
FIG. 5B is a partial enlarged sectional view taken along the line A-A of FIG. 5A.
Figure 5C:
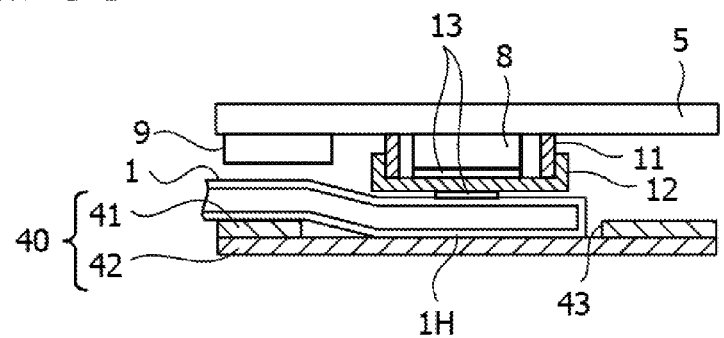
FIG. 5C is a partial enlarged sectional view taken along the line B-B of FIG. 5A.

FIG. 5A illustrates the connection structure of the heat sink plate 40, the heat pipe 1, and the board 5. FIG. 5B illustrates a partial enlarged sectional view taken along the line A-A of FIG. 5A. FIG. 5C illustrates a partial enlarged sectional view taken along the line B-B of FIG. 5A. In particular, FIG. 5C represents a state where the high temperature portion 1H is attached onto the second heat sink plate 42 exposed within the through hole 43 in a state where the high temperature portion 1H of the heat pipe 1 is further lowered by being curved. In the first embodiment, the high temperature portion 1H of the heat pipe 1 is soldered and fixed to the second heat sink plate 42.

Here, it is assumed that the thickness of the heat sink plate 40 in the first embodiment is the same as the thickness of the heat sink plate 4 in the comparative technology illustrated in FIG. 2A, and the heat pipe 1 and the member mounted on the board 5 in the first embodiment are also the same as those of the comparative technology. Then, in the first embodiment, the distance D1 between the external side of the board 5 and the external side of the heat sink plate 40 (the external side of the second heat sink plate 42) may be reduced by the thickness of the first heat sink plate 41 (about 0.1 mm), as compared to the distance D between the external side of the board 5 and the external side of the heat sink plate 4 illustrated in FIG. 2A.

That is, even when the same heat pipe 1 is used, the distance D1 between the external side of the board 5 and the external side of the heat sink plate 40 may be reduced. Meanwhile, in the area of the board 5 other than the portion thereof where the heating element 8 is mounted, since the height of another component 9 mounted on the board 8 is low, the component 9 does not interfere with the heat pipe 1 disposed on the first heat sink plate 41. As a result, in the electronic device of the first embodiment, the thickness of the case may be made thinner than that of the case of the electronic device of the comparative technology. Meanwhile, since the thickness of the case is reduced by the thickness of the first heat sink plate 41, the thickness of the heat pipe 1 may be made as thick as about 0.1 mm. In that case, the improvement of the performance of the heat pipe 1 may be expected.

Figure 6:
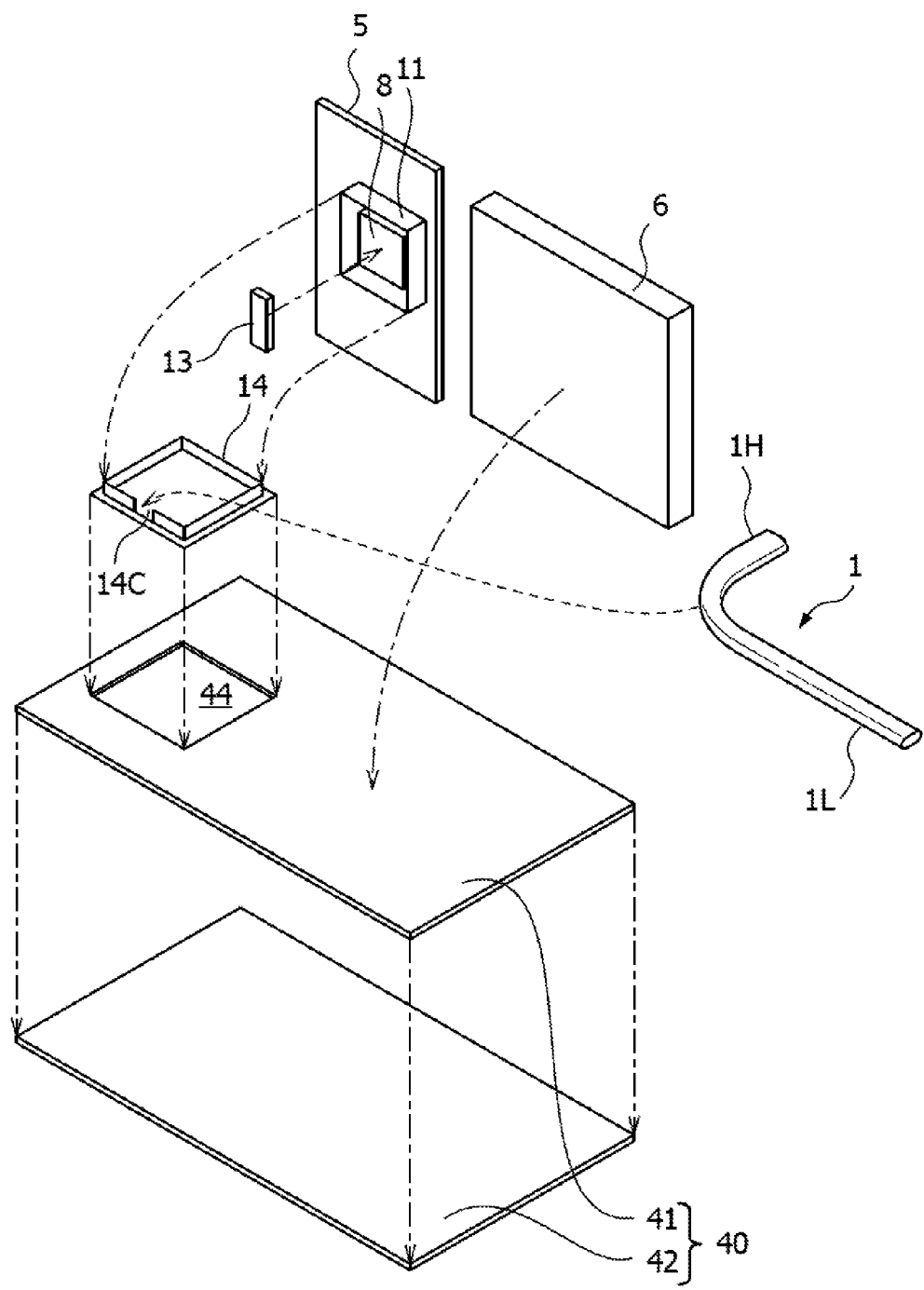
FIG. 6 is an exploded perspective view for explaining a second embodiment of the mounting structure of the heat pipe to be mounted inside the electronic device of the present disclosure.

Next, descriptions will be made on a second embodiment of the mounting structure of the heat pipe in the case of the electronic device of the present disclosure using FIGS. 6 to 8B. As illustrated in FIG. 6, in the second embodiment, the shield structure of the heating element 8 is different from that in the first embodiment. In the first embodiment, the shield frame 11 is provided around the heating element 8 mounted on the board 5, and the opening side of the shield frame 11 is sealed by the shield cap 12. Meanwhile, the second embodiment is identical to the first embodiment in that the shield frame 11 is provided around the heating element 8 mounted on the board 5, but different from the first embodiment in that, in the second embodiment, a heat sink plate shield frame 14 is provided instead of the shield cap 12. The second embodiment is also identical to the first embodiment in that one of the heat conducting sheets 13 is attached onto the heating element 8.

The heat sink plate shield frame 14 has an external dimension to be fitted into a shield frame through hole 44 formed on the first heat sink plate 41 and is soldered and fixed to the second heat sink plate 42 in the state where the first heat sink plate 41 is stacked on the second heat sink plate 42. In addition, a notch 14C is formed on one side of the heat sink plate shield frame 14 to cause the heat pipe 1 to pass through the notch 14C. The heat pipe 1 used in the second embodiment is the same as the heat pipe 1 used in the first embodiment and has a substantially L shape of which the short side is the high temperature portion 1H and the long side is the low temperature portion 1L.

Figure 7:
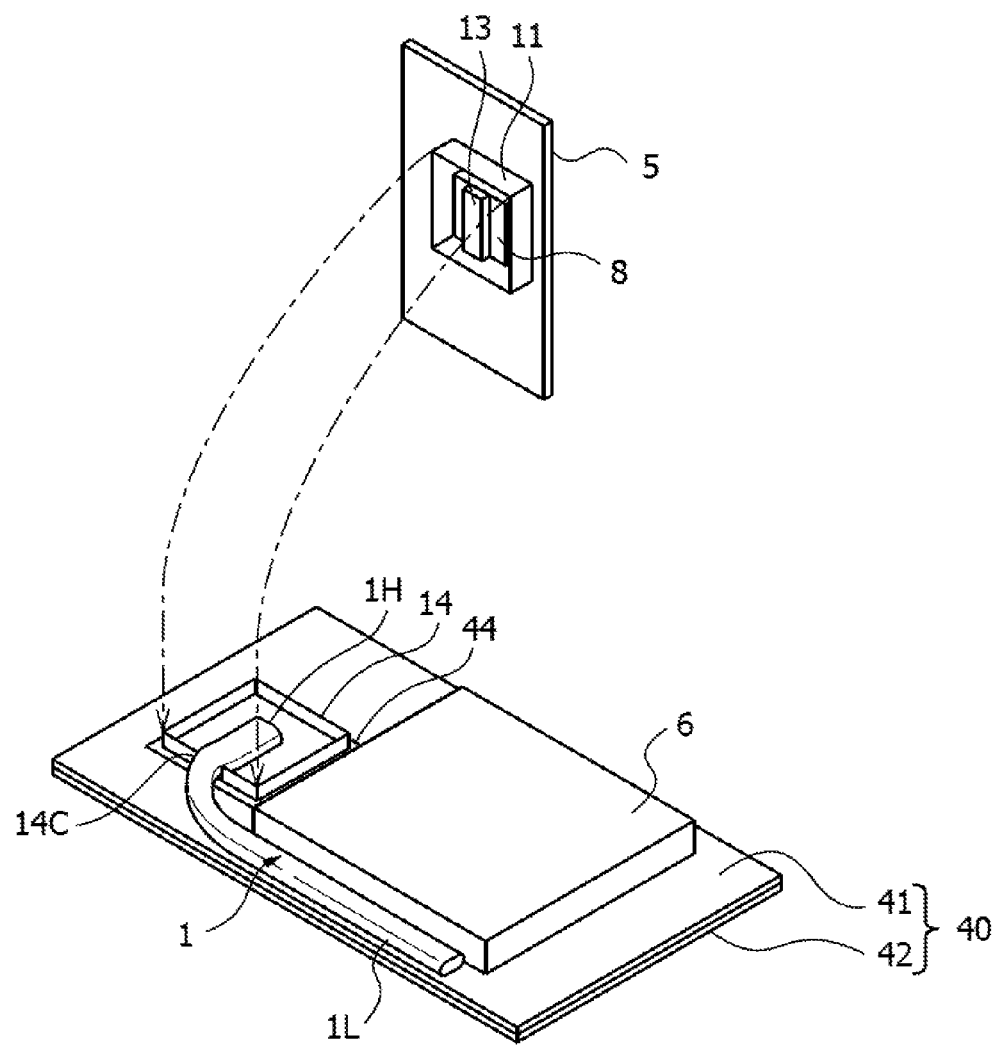
FIG. 7 is an exploded perspective view illustrating a state where a heat sink plate shield frame, a heat pipe, and a battery are mounted on a heat sink plate illustrated in FIG. 6.
Figure 8A:
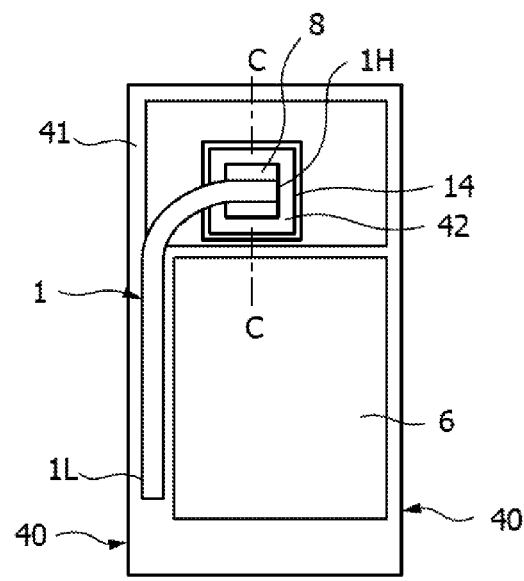
FIG. 8A is a back view illustrating a state where the heat pipe, the board, and the battery are mounted on the heat sink plate illustrated in FIG. 6.

In the second embodiment, as illustrated in FIG. 7, the high temperature portion 1H of the heat pipe 1 is disposed within the shield frame through hole 44 and soldered and fixed to the second heat sink plate 42 exposed within the shield frame through hole 44. In this case, the portion of the heat pipe 1 where the high temperature portion 1H is continuous to the low temperature portion 1L is disposed within the notch 14C formed in the shield frame through hole 44. Then, the low temperature portion 1L of the heat pipe 1 is disposed on the lateral surface of the battery 6 mounted on the first heat sink plate 41. In this state, the shield frame 11 is fitted into the heat sink plate shield frame 14 so that the board 5 is mounted on the heat sink plate 40. FIG. 8A illustrates this state.

Figure 8B:
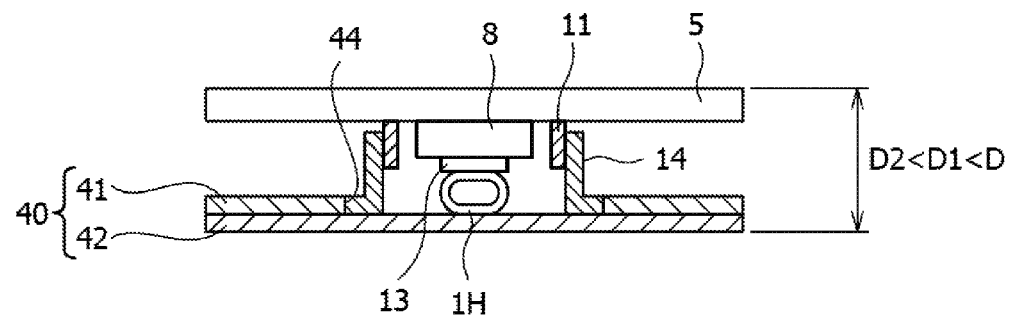
FIG. 8B is a partial enlarged sectional view taken along the line C-C of FIG. 8A.

FIG. 8A illustrates the connection structure of the heat sink plate 40, the heat pipe 1, and the board 5 which are illustrated in FIG. 6. FIG. 8B illustrates a partial enlarged sectional view taken along the line C-C of FIG. 8A. As illustrated in FIG. 8B, in the second embodiment, the heat sink plate shield frame 14 corresponding to the shield cap 12 of the first embodiment is soldered and fixed to the second heat sink plate 42 within the shield frame through hole 44. That is, in the second embodiment, the metal-made first heat sink plate 41 functions as the shield cap 12 of the first embodiment to shield the heating element 8 from electromagnetic waves.

Here, it is assumed that the thickness of the heat sink plate 40 of the second embodiment is the same as the thickness of the heat sink plate 40 of the first embodiment, and the heat pipe 1 and the member mounted on the board 5 are also the same as those of the first embodiment. Then, in the second embodiment, the distance D2 between the external side of the board 5 and the external side of the heat sink plate 40 may be reduced by the thickness of the shield cap 12 and the thickness of the heat conducting sheet 13, as compared to the distance D1 between the external side of the board 5 and the external side of the heat sink plate 40. That is, in the electronic device of the second embodiment, the thickness of the case may be made thinner than that of the electronic device of the first embodiment.

Figure 9:
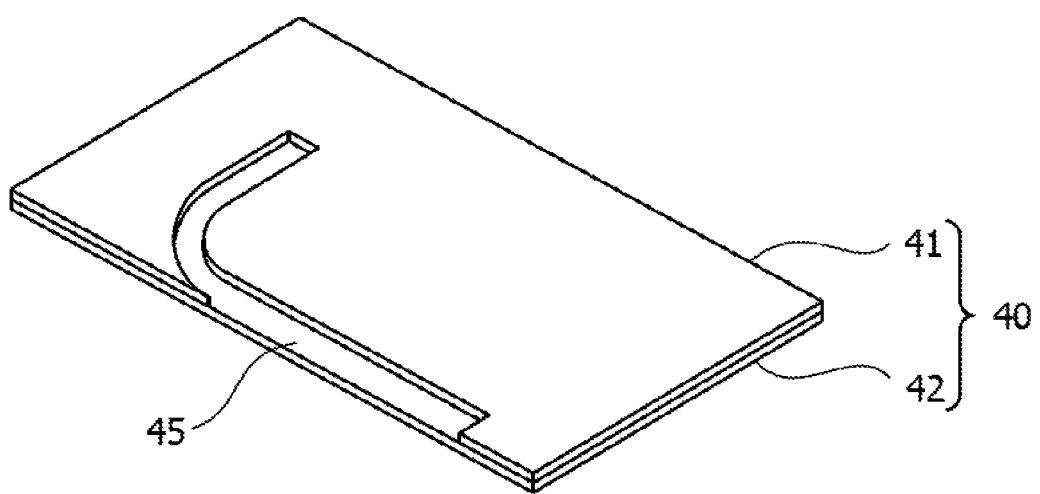
FIG. 9 is a perspective view illustrating another embodiment of the heat sink plate mounted inside the electronic device of the present disclosure.

Meanwhile, in the above-described first and second embodiments, the first heat sink plate 41 is cut out to form the through hole 43 or 44 so as to accommodate only the high temperature portion 1H of the heat pipe 1 and stacked on the second heat sink plate 42. Thus, what is in contact with the second heat sink plate 42 is only the high temperature portion 1H of the heat pipe 1. Meanwhile, in the embodiment illustrated in FIG. 9, a notch 45 is formed on the first heat sink plate 41 over the entire length of the heat pipe 1. Thus, the size and the shape of the notch formed on the first heat sink plate 41 are not specifically limited.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiments of the present disclosure have been described in detail, it should be understood that the various changes, substitutions, and alterations could be made hereto without departing from the spirit and scope of the disclosure.

What is claimed is:

1. An electronic device comprising:
   a board having a first surface on which a heating element is mounted;
   a heat sink plate disposed to face the first surface of the board; and
   a heat pipe disposed between the board and the heat sink plate such that one end of the heat pipe is disposed at a position where the one end is in contact with the heating element, and the other end of the heat pipe is disposed to be in contact with the heat sink plate,
   wherein the heat sink plate has a stacking structure of a first heat sink plate of which a front surface faces the board, and a second heat sink plate disposed on a rear surface of the heat sink plate,
   a through hole is formed at a position on the first heat sink plate which faces the heating element to expose the second heat sink plate, and
   the one end of the heat pipe is attached on a front surface of the second heat sink plate facing the first heat sink plate through the through hole of the first heat sink plate, and the other end of the heat pipe is disposed to be in contact with a front surface of the first heat sink plate facing the board.

2. The electronic device according to claim 1, wherein a heat conductivity of the first heat sink plate is different from a heat conductivity of the second heat sink plate.

3. The electronic device according to claim 1, wherein the first and second heat sink plates are formed of different kinds of metals having different characteristics.

4. The electronic device according to claim 3, wherein the first heat sink plate is formed of a metal having a low heat conductivity and high vertical elasticity modulus and tensile strength, and
   the second heat sink plate is formed of a metal having a higher heat conductivity than that of the first heat sink plate and lower vertical elasticity modulus and tensile strength that those of the first heat sink plate.

5. The electronic device according to claim 1, wherein the one end of the heat pipe is fixed to the second heat sink plate by a solder within the through hole.

6. The electronic device according to claim 1, wherein the other end side of the heat pipe is curved from the one end side of the heat pipe and disposed along a longitudinal side of the heat sink plate.

7. The electronic device according to claim 1, wherein a shield frame is mounted around the heating element on the board to block an electromagnetic wave, an opening of the shield frame is sealed by a shield cap, and heat of the heating element is transferred to the heat pipe through the shield cap.

8. The electronic device according to claim 1, wherein a shield frame is mounted around the heating element on the board to block an electromagnetic wave, a heat sink plate side shield frame is soldered and attached within the through hole of the heat sink plate to be fitted on the shield frame, and the heat of the heating element is directly transferred to the heat pipe.

9. The electronic device according to claim 8, wherein a notch is formed on one side of the heat sink plate shield frame to take a portion of the heat pipe extending from the one end thereof out of the through hole.

\* \* \* \* \*